(12) United States Patent
Chun (10) Patent No.: US 6,532,184 B2
(45) Date of Patent: Mar. 11, 2003

(54) PRECHARGE CONTROL SIGNAL GENERATOR, AND SEMICONDUCTOR MEMORY DEVICE USING THE SAME

(75) Inventor: Jun Hyun Chun, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 09/994,652

(22) Filed: Nov. 28, 2001

(65) Prior Publication Data

US 2002/0167859 A1 Nov. 14, 2002

(30) Foreign Application Priority Data

May 10, 2001 (KR) .......................................... 2001-25522

(51) Int. Cl.[7] ................................................. G11C 7/00
(52) U.S. Cl. ........................ 365/203; 365/201; 365/233
(58) Field of Search ................................. 365/201, 203, 365/233

(56) References Cited

U.S. PATENT DOCUMENTS

| 5,432,747 A | 7/1995 | Fuller et al. ................. 365/203 |
| 5,471,430 A | 11/1995 | Sawada et al. .............. 365/222 |
| 5,905,690 A | 5/1999 | Sakurai et al. ............... 365/233 |
| 6,061,285 A | * 5/2000 | Tsukikawa ................... 365/201 |
| 6,061,294 A | * 5/2000 | Koshikawa .................. 365/233 |
| 6,108,248 A | 8/2000 | Oh .............................. 365/193 |
| 6,185,141 B1 | * 2/2001 | Hoshita et al. .............. 365/203 |

FOREIGN PATENT DOCUMENTS

| JP | 10-092175 | 4/1998 |
| JP | 11-149771 | 6/1999 |

* cited by examiner

Primary Examiner—Son Mai
(74) Attorney, Agent, or Firm—Pillsbury Winthrop LLP

(57) ABSTRACT

A semiconductor memory device generates a precharge control signal asynchronous from a clock signal. The semiconductor memory device includes a memory cell array for storing data, and a precharge control signal generator for generating a precharge control signal in a test mode, by employing a predetermined control signal which does not influence access to the data stored in the memory cell array, even when maintained in a high or low level in the test mode. The precharge control signal generator receives the control signal, outputs a signal having an identical state to the control signal in the normal mode, and also outputs a signal fixed in a high or low level in the test mode. As a result, it is possible to generate the precharge control signal which does not require a delay time as long as a command hold time.

15 Claims, 9 Drawing Sheets

PRECHARGE CONTROL SIGNAL GENERATOR, AND SEMICONDUCTOR MEMORY DEVICE USING THE SAME

BACKGROUND OF THE INVENTION

1. Field of the Invention

The present invention relates to a synchronous memory device, and in particular to an improved synchronous memory device having an asynchronous precharge function which can input an interval between commands regardless of a clock period. It accomplishes this by generating a precharge control signal asynchronous with respect to a clock signal by using a clock enable signal or chip selector bar signal which is not synchronous with the clock signal.

2. Description of the Background Art

Figure 1:
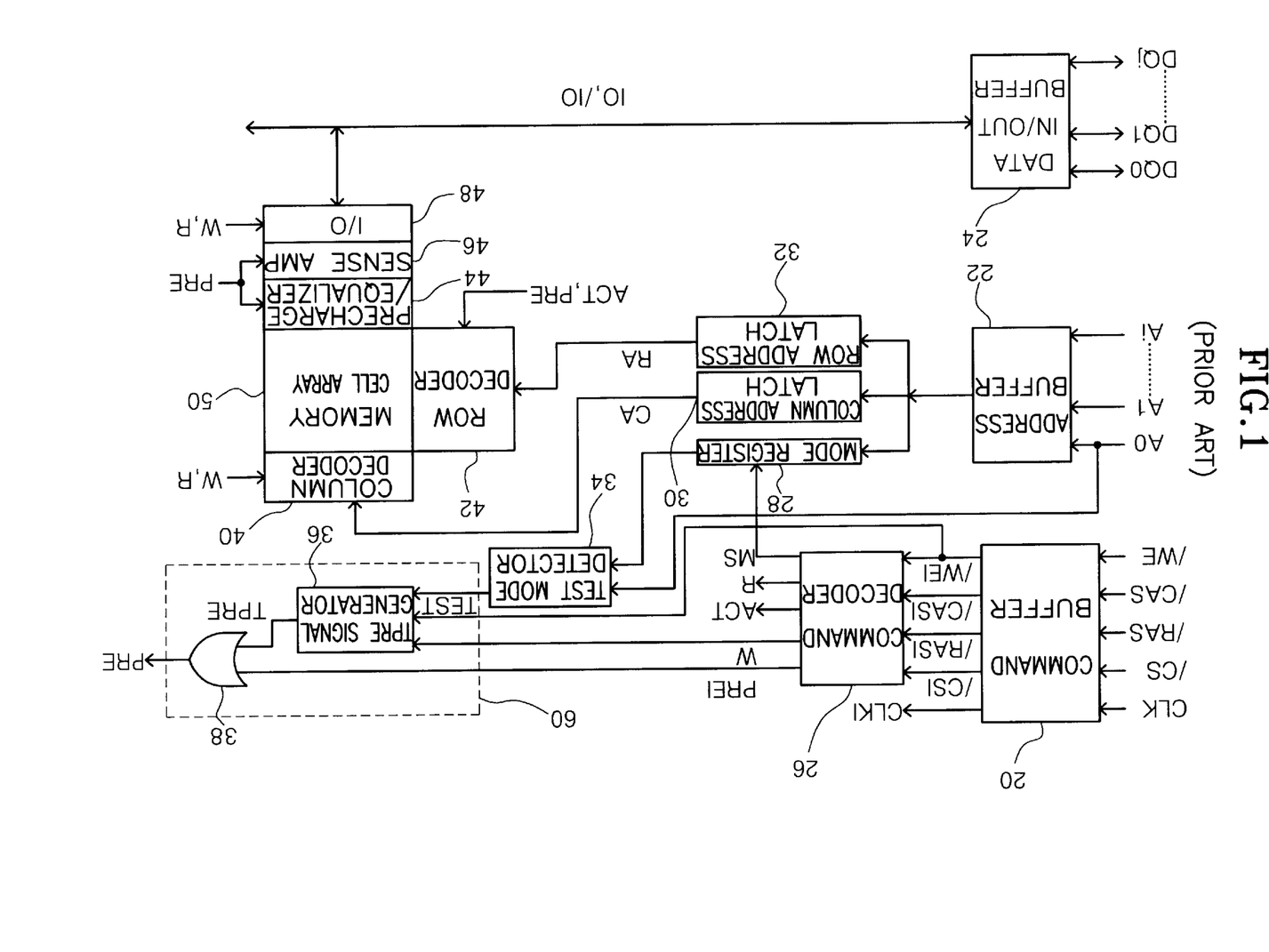
FIG. 1 (Prior Art) is a block diagram illustrating a conventional synchronous memory device.

A conventional synchronous DRAM will now be explained with reference to FIGS. 1 through 5. FIG. 1 (Prior Art) is a block diagram illustrating a conventional synchronous memory device. The conventional synchronous DRAM includes a command buffer 20 receiving external commands such as a clock signal CLK, a chip selector signal /CS, a ras bar signal /RAS, a cas bar signal /CAS and a write bar signal /WE; an address buffer 22 receiving external addresses A0–Ai; and a data IN/OUT buffer 24 receiving and outputting data signals DQ0–DQj.

The conventional synchronous DRAM also includes a command decoder 26 receiving the output signals /CSI, /RASI, /CASI, /WEI from the command buffer 20, and generating a precharge control signal PREI for controlling the internal operation, a write signal W, an active signal ACT, a read signal R and a mode selection signal MS. A mode register 28 receives the output signal from the address buffer 22 and the mode selection signal MS from the command decoder 26, and controls an operation mode. A test mode detector 34 receives the address signal A0 and the output signal from the mode register 28, and generates a test mode detection signal TEST. A precharge control signal generator 60 comprising a TPRE signal generator 36 receives the write signal W from the command decoder 26, the write enable signal /WEI from the command buffer 20, and the detection signal TEST from the test mode detector 34, and generates a test mode precharge control signal TPRE. An OR gate 38 ORs the precharge control signal PREI from the command decoder 26 and the TPRE signal from the TPRE signal generator 36, and generates a precharge control signal PRE.

In addition, the conventional synchronous DRAM includes a column address latch unit 30 latching the column address signal from the address buffer 22, and is generating a column address latch signal CA. A column decoder 40 decodes the column address latch signal CA from the column address latch unit 30, and selects a bit line of a memory cell array unit 50. A row address latch unit 32 receives the address signal from the address buffer 22, and generates a row address latch signal RA. A row decoder 42 decodes the row address latch signal RA from the row address latch unit 32, and selects a word line of the memory cell array unit 50.

The conventional synchronous DRAM includes a precharge/equalize unit 44 precharging and equalizing a bit line potential of the memory cell array unit 50 into half a potential 1/2Vcc according to the precharge control signal PRE from the OR gate 38, when data are not written/read to/from the memory cell array 50. A sense amplifier unit 46 precharges and equalizes the bit line potential into half a potential 1/2Vcc according to the precharge control signal PREI, when data are not written/read to/from the memory cell array 50, and amplifies data of the bit line, when data are written/read to/from the memory cell array 50. I/O unit 48 connects the data inputted/outputted through the data IN/OUT buffer 24 to the sense amplifier unit 46.

Figure 2:
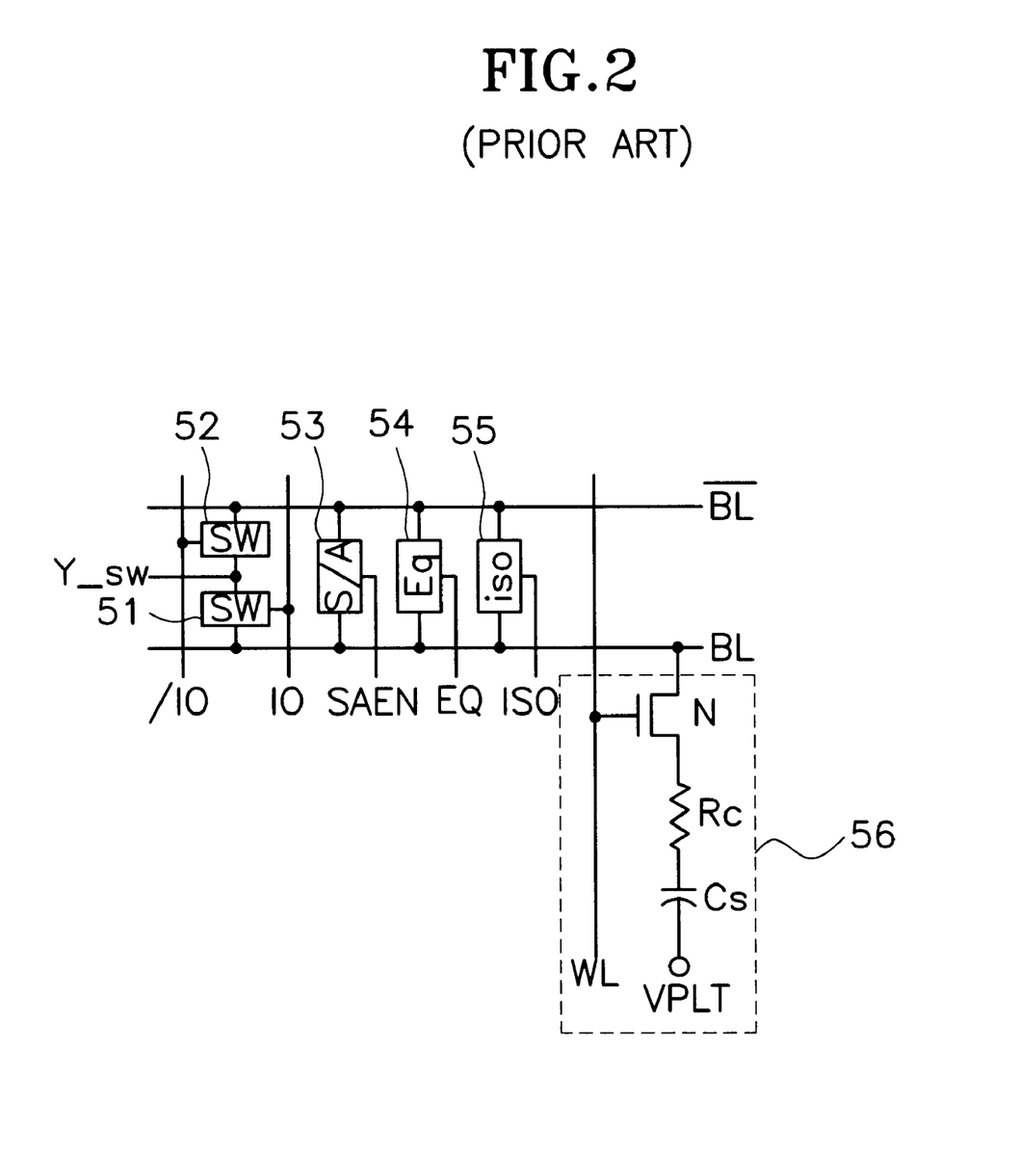
FIG. 2 (Prior Art) is a block diagram illustrating a conventional synchronous memory array.

FIG. 2 (Prior Art) is a block diagram of a conventional synchronous memory array. The memory array includes a memory cell 56 comprising one NMOS transistor N and one capacitor Cs. One terminal of the capacitor Cs is connected to the NMOS transistor N through a resistor Rc, and the other terminal is supplied with cell plate voltage VPLT. If an word line WL is selected according to an address signal and then sense amplifier enable signal SAEN is activated, a sense amplifier 53 amplifies data of the bit line BL and bit bar line /BL. Switch circuit units 51 and 52 switch the I/O lines IO, /IO and bit lines BL, /BL according to a column decoder signal Y_sw. An equalizing circuit 54 equalizes the bit lines BL, /BL according to an equalize signal EQ. A division circuit 55 divides the bit lines BL, /BL according to a control signal ISO.

Figure 3:
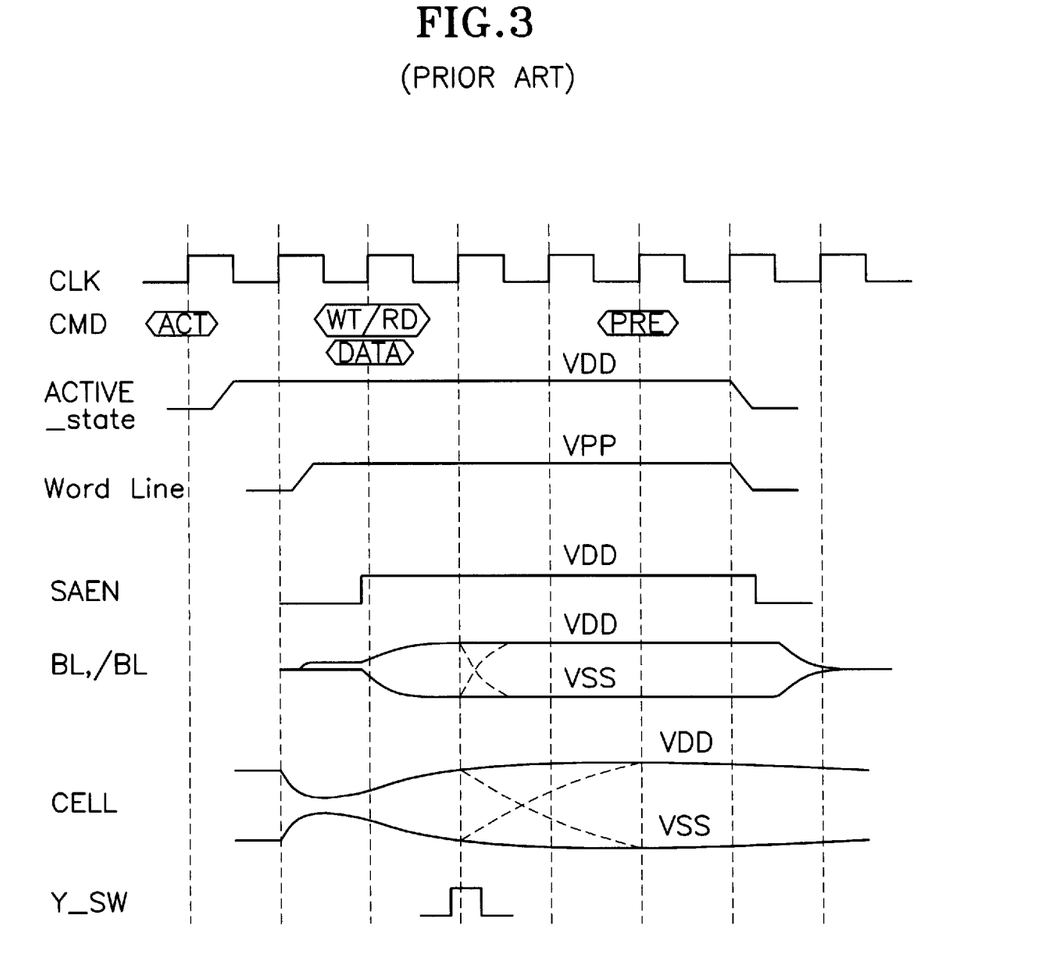
FIG. 3 (Prior Art) is an operation timing diagram of the conventional synchronous memory device.

FIG. 3 (Prior Art) is a timing diagram of an array operation of the conventional synchronous memory device. The operation of the conventional synchronous memory device is controlled according to a command signal CMD synchronous with an external clock signal CLK. In the command signal CMD, ACT means active command, WT means write command, RD means read command, and PRE means precharge command. In FIG. 3, SAEN is a sense amplifier enable signal, BL and /BL are bit line signals, CELL is a voltage signal of a memory cell, Y_sw is a column decoder signal. And in FIG. 3, VDD indicates power supply voltage, VPP indicates high voltage, and VSS indicates substrate voltage.

Firstly, the memory array is controlled in an active state according to the active command ACT (ACTIVE_STATE= high), a specific word line is selected according to the row address (Word Line=VDD~VPP), and thus a data of the memory cell is applied to the bit line BL and the bit bar line /BL according to charge sharing. Here, the bit line BL and the bit bar line /BL have a small potential difference due to a capacitance ratio between the memory cell and the bit line, which is sensed to a wanted potential by the operation of the sense amplifier (SAEN=high).

Thereafter, when a column command signal R or W is externally inputted, data can be inputted to the memory device and outputted from the memory device through a date in/out pin(not shown in the figures) according to the operation of the data IN/OUT buffer 24, the sense amplifier unit 46 and the I/O unit 48. At this time, if a succeeding column command is the write command W and the inputted data is different from the data stored in the memory array, the bit line BL, the bit bar line /BL and the memory cell renew data of the memory cell according to the operation indicated by a dotted line of FIG. 3. The data of the memory cell are renewed later than the data of the bit line BL and the bit bar line /BL. Such a delay is generated by a parasitic resistance element such as a transistor and a contact hole of the memory cell due to integration of the memory device.

After the column operation of the write and read operation, a data storage state of the memory cell is normally maintained and the precharge control signal PRE is applied to perform a succeeding row access operation. When the precharge control signal PRE is inputted, the data of the memory cell are maintained, the word line, the sense amplifier enable signal SAEN, the bit line BL and the bit bar line /BL are sequentially disabled, and the memory device is prepared to perform the succeeding row access operation. As described above, the operation of the conventional synchronous memory device is performed according to the command CMD synchronous with clock signal CLK.

Figure 4:
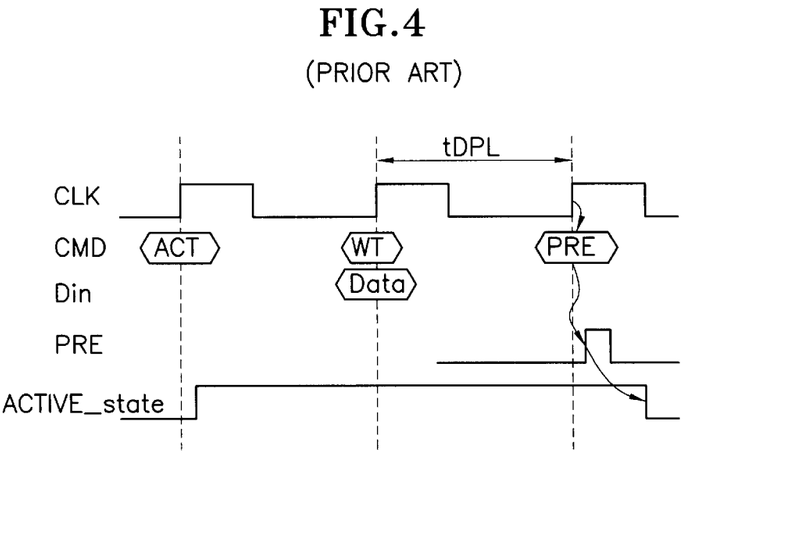
FIG. 4 (Prior Art) is a timing diagram of a write operation of the conventional synchronous memory device.

FIG. 4 (Prior Art) is a timing diagram of the write operation of the conventional synchronous memory device. When the active command signal ACT synchronous with a rising period of clock signal CLK is inputted, the memory array is controlled in an active state (ACTIVE_STATE= high). Thereafter, when a write command signal WT is inputted in the active state of the memory array (ACTIVE_ STATE=high), a series of operations are performed to input a write data through a DQ pin and store the data in the memory array. When the precharge control signal PRE is inputted, the active state signal ACTIVE_state of the memory array enabled in a high level is disabled in a low level. Accordingly, in the write operation of the conventional synchronous memory device, the active state signal ACTIVE_state of the memory array is set to a high level according to the active command signal ACT, and reset to a low level according to the precharge control signal PRE.

Figure 5:
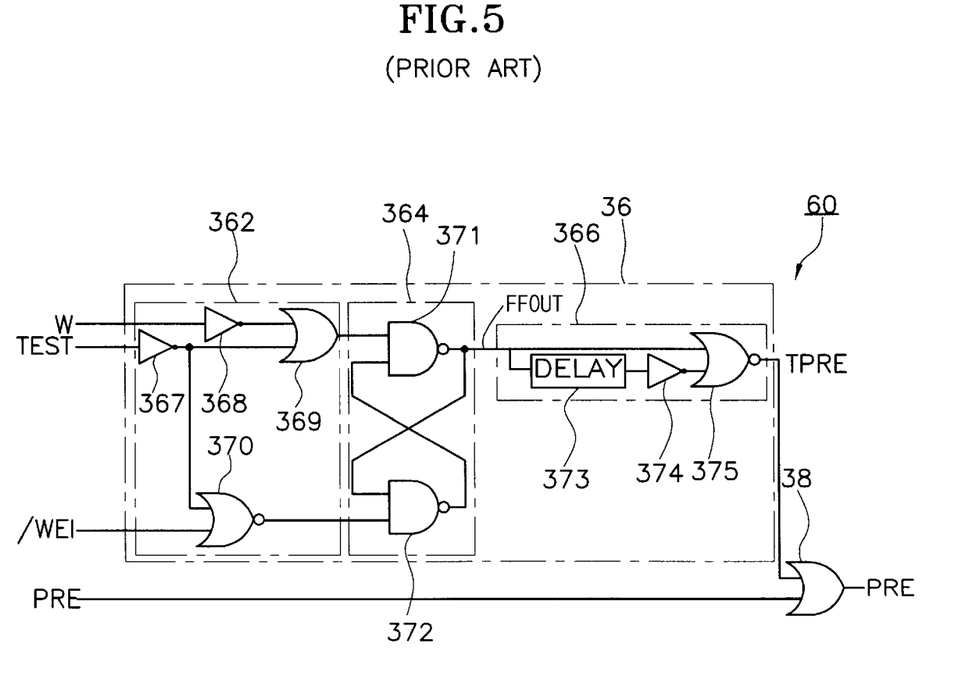
FIG. 5 (Prior Art) is a circuit diagram illustrating a precharge control signal generator of the conventional synchronous memory device.

FIG. 5 (Prior Art) is a circuit diagram illustrating the precharge control signal generator of the conventional synchronous memory device. The precharge control signal generator 60 includes a controller 362 receiving the write signal W from the command decoder 26, the test signal TEST from the test mode detector 34 and the write enable signal /WEI from the command buffer 20, and controls a test mode state. An RS flip flop unit 364 latches the output signal from the controller 362. A pulse generator 366 detects a falling edge of the output signal FFOUT from the RS flip flop unit 364, and generates a short pulse and the test mode precharge control signal TPRE. OR gate 38 ORs the test mode precharge control signal TPRE from the pulse generator 366 and the precharge control signal PRE of a normal mode from the command decoder 26, and generates the precharge control signal PRE.

The controller 362 includes an inverter 368 receiving the write signal W from the command decoder 26, and outputting an inverted signal. An inverter 367 receives the test signal TEST from the test mode detector 34, and outputs an inverted signal. An OR gate 369 ORs the output signals from the inverters 367, 368. A NOR gate 370 NORs the output signal from the inverter 367 and the write enable signal /WEI from the command buffer 20.

The RS flip flop unit 364 includes a NAND gate 371 receiving the output signal from the OR gate 369 as a reset signal. A NAND gate 372 receives the output signal from the NOR gate 370 as a set signal. In addition, the output terminal of the NAND gate 371 is connected to the input terminal of the NAND gate 372, and the output terminal of the NAND gate 372 is connected to the output terminal of the NAND gate 371.

The pulse generator 366 includes a delay 373 delaying the output signal FFOUT from the RS flip flop unit 364 for a predetermined time. An inverter 374 receives the output signal from the delay 373. A NOR gate 375 NORs the output signal FFOUT from the RS flip flop unit 364 and the output signal from the inverter 374, and generates the test mode precharge control signal TPRE.

The operation of the conventional precharge control signal generator 60 will now be explained with reference to the operation timing diagram of FIG. 6 (Prior Art). When the output signal from the test mode detector 34 is maintained at a high level according to the test mode setting, if the write command WT is inputted, the write signal W generates a high level short pulse at the rising edge of the clock signal CLK. The write signal W resets the RS flip flop unit 364 to maintain its output signal FFOUT in a high level. Thereafter, when the write enable bar signal /WEI is transited to a high level, the output signal FFOUT from the RS flip flop unit 364 is transited to a low level. In addition, the test mode precharge control signal TPRE becomes a high level short pulse by the pulse generator 366, and the precharge control signal PRE from the command decoder 26 also becomes a high level short pulse.

Therefore, the conventional precharge control signal generator 60 generates a precharge signal synchronous with the rising edge of the clock signal CLK according to the precharge control signal PRE, and a precharge signal asynchronous from the clock signal CLK according to the test mode precharge control signal TPRE.

Figure 6:
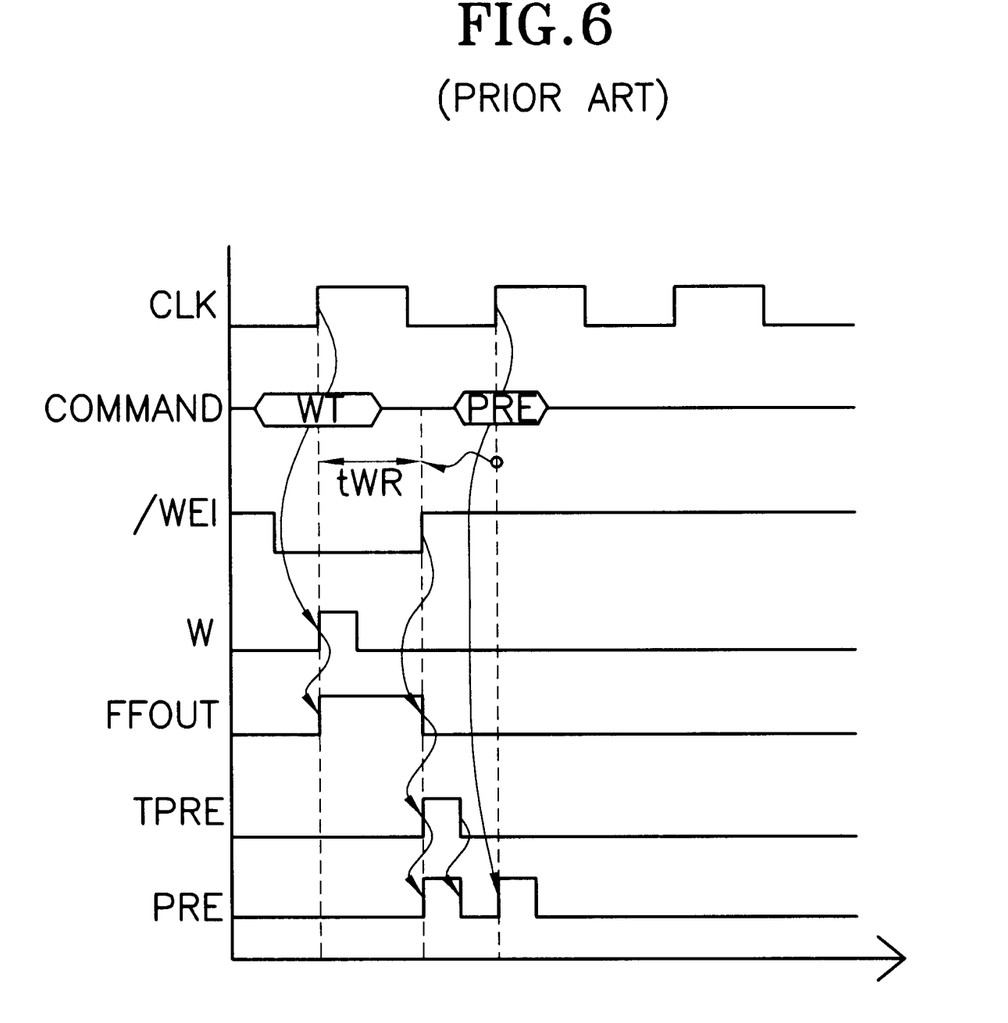
FIG. 6 (Prior Art) is an operation timing diagram of the precharge control signal generator FIG. 5.

However, the conventional synchronous memory device has a disadvantage in that the precharge control signal generator can generate the precharge control signal for the test mode after input of the write command, when at least a hold time tWR of the write command elapses (refer to FIG. 6).

Accordingly, when the conventional synchronous memory device generating the precharge control signal according to the command signal intends to perform the test operation by using a tester having a lower frequency than its operation speed, to shorten an interval between the commands more than a period of the clock signal for the test operation, or to perform an inverse operation thereon, the memory device cannot adjust the interval between the commands due to the hold time of the command, and thus is not able to perform the test operation.

Moreover, the conventional synchronous memory device employs active circuits and write/read circuits by commands, thus increasing a layout area.

SUMMARY OF THE INVENTION

The inventions claimed and described herein provide a synchronous memory device having an asynchronous precharge function which can perform a test operation regardless of performance of a memory tester system.

They also provide a synchronous memory device having an asynchronous precharge function which can input an interval between commands regardless of a clock period, by generating a precharge control signal asynchronous from an externally-inputted clock signal by using a clock enable signal or chip selector bar signal which is not synchronous with the clock signal, when intending to generate the precharge control signal for a test mode after input of a read or write command.

Furthermore, the inventions claimed and described herein provide a synchronous memory device having an asynchronous precharge function which allows for a reduced layout area by removing circuits that would otherwise be required for each command, by generating a precharge control signal asynchronous from a clock signal.

The inventions provide a semiconductor memory device with a normal mode and a test mode. The memory device includes a memory cell array for storing data; and a precharge control signal generator for generating a precharge control signal in the test mode, by using a predetermined control signal which does not influence access to the data stored in the memory cell array, even when maintained in a high or low level in the test mode.

The precharge control signal generator receives the predetermined control signal, outputs a signal having an identical state to the control signal in the normal mode, and outputs a signal fixed in a high or low level in the test mode. Preferably, the precharge control signal generator includes a delay unit for equalizing a setting time of the precharge control signal after input of a command in the normal mode to a setting time of the precharge control signal after input of the control signal in the test mode. When input of the commands is synchronous with a rising edge of the clock signal in the normal mode, the precharge control signal generator generates the precharge control signal synchronously with the rising edge of the control signal in the test mode.

In addition, a synchronous memory device having an asynchronous precharge function includes a memory cell array unit having a plurality of memory cells for storing a plurality of data. A CLK/CKE buffer receives an external clock signal and a clock enable signal, and generates an internal clock signal and an internal clock enable signal. A command buffer receives external commands such as a chip selector bar signal, a ras bar signal, a cas bar signal and a write bar signal. An address buffer receives external addresses. A data I/O buffer inputs/outputs data signals. A command and state unit receives the address signal from the address buffer, the internal clock signal from the CLK/CKE buffer, the output signal from the command buffer and the internal clock enable signal from the precharge control signal generator, and generates control signals for controlling internal operations. A mode register receives the address signal from the address buffer and the mode election signal from the command and state unit, and outputs control signals for controlling operation modes. A row/column address control and decoding circuit accesses a predetermined position of the memory cell array unit according to the address signal from the address buffer, and controls a read/write operation. An I/O data processing circuit controls data input/output in the read/write operation according to the output signal from the command and state unit. An asynchronous precharge control signal generator receives the internal precharge control signal from the command and state unit, the internal clock enable signal from the CLK/CKE buffer and the test mode signal from the mode register, and generates the internal clock enable signal and the precharge control signal.

The row/column address control and decoding circuit includes a row latch unit receiving the address signal from the address buffer, and latching a row address signal. A row predecoder predecodes the row address signal from the row latch unit. A row decoder decodes the output signal from the row predecoder, and selects a word line of the memory cell array unit. A column latch unit receives the column address signal from the address buffer, and latches a column address signal. A column predecoder predecodes the column address signal from the column latch unit. A column decoder decodes the output signal from the column predecoder and selects a bit line of the memory cell array unit.

The I/O data processing circuit includes a sense amplifier unit sensing and amplifying data of the bit line, when data are written/read to/from the memory cell array unit. A read control unit controls the read data from the sense amplifier unit to be transmitted to the data I/O buffer. A write control unit controls the write data from the data I/O buffer to be transmitted to the sense amplifier unit.

The precharge control signal generator includes a delay chain delaying the internal clock enable signal from the CLK/CKE buffer for a predetermined time. An AND gate ANDs the test mode detection signal from the mode register for controlling a precharge mode and the output signal from the delay chain. An OR gate ORs the internal precharge control signal from the command and state unit and the output signal from the AND gate, and outputs the precharge control signal. An OR gate ORs the test mode detection signal and the internal clock enable signal, and generates the internal clock enable signal.

The delay chain includes an even number of inverters.

According to another aspect of the present invention, a synchronous memory device includes a memory cell array unit having a plurality of memory cells for storing a plurality of data. A CLK/CKE buffer receives an external clock signal and a clock enable signal, and generates an internal clock signal. A command buffer receives external commands such as a chip selector bar signal, a ras bar signal, a cas bar signal and a write bar signal. An address buffer receives external addresses. A data I/O buffer inputs/outputs data signals. A command and state unit receives the address signal from the address buffer, the internal clock signal from the CLK/CKE buffer, the output signal from the command buffer and the internal chip selector bar signal from the precharge control signal generator, and generates control signals for controlling internal operations. A mode register receives the address signal from the address buffer and the mode selection signal from the command and state unit, and outputs control signals for controlling operation modes. A row/column address control and decoding circuit accesses a predetermined position of the memory cell array unit according to the address signal from the address buffer, and controls a read/write operation. An I/O data processing circuit controls data input/output in the read/write operation according to the output signal from the command and state unit. An asynchronous precharge control signal generator receives the internal precharge control signal from the command and state unit, the internal chip selector bar signal from the command buffer and the test mode signal from the mode register, and generates the internal chip selector bar signal and the precharge control signal.

The row/column address control and decoding circuit includes: a row latch unit receiving the address signal from the address buffer, and latching a row address signal. A row predecoder predecodes the row address signal from the row latch unit. A row decoder decodes the output signal from the row predecoder, and selects a word line of the memory cell array unit. A column latch unit receives the column address signal from the address buffer, and latches a column address signal. A column predecoder predecodes the column address signal from the column latch unit. A column decoder decodes the output signal from the column predecoder, and selects a bit line of the memory cell array unit.

The I/O data processing circuit includes a sense amplifier unit which senses and amplifies data of the bit line, when data are written/read to/from the memory cell array unit. A read control unit controls the read data from the sense amplifier unit to be transmitted to the data I/O buffer. A write control unit controls the write data from the data I/O buffer to be transmitted to the sense amplifier unit.

The precharge control signal generator includes a delay chain for delaying the internal chip selector bar signal from the command buffer for a predetermined time. An AND gate ANDs the test mode detection signal from the mode register for controlling a precharge mode and the output signal from the delay chain. An OR gate ORs the internal precharge control signal from the command and state unit and the output signal from the AND gate and outputs the precharge control signal. An AND gate ANDs an inverted signal of the test mode detection signal and the internal chip selector signal, and generates the internal chip selector bar signal.

The delay chain includes an even number of inverters.

According to still another aspect of the present invention, a synchronous memory device receiving a command for a read/write operation synchronously with an external clock signal, and having a memory cell storing a plurality of data and an I/O circuit inputting/outputting the data of the memory cell in the read/write operation, includes an asynchronous command input control signal generator for generating an asynchronous command input control signal asynchronous from the clock signal according to an input pulse signal asynchronous from the clock signal, and controlling input of an external command signal asynchronous from the clock signal according to the asynchronous command input control signal.

The input pulse signal asynchronous from the clock signal may be a clock enable signal. And the input pulse signal asynchronous from the clock signal may be a chip selector bar signal.

As discussed earlier, the synchronous memory device having the asynchronous precharge function can input an interval between the commands regardless of the clock period, by generating the precharge control signal PRE by using the clock enable signal CLK or chip selector bar signal /CS which is not synchronous with the clock signal CLK, when intending to generate the precharge control signal PRE for the test mode after input of the write command in the write operation.

Especially, in order to efficiently test a specific operation parameter of the high frequency synchronous memory device in a wafer or package level and screen a defect thereof, the test operation should be performed with a sufficient margin. The conventional synchronous DRAM using the precharge control signal generator cannot obtain a sufficient margin due to poor performance of the memory tester. However, the synchronous memory device having the asynchronous precharge function in accordance with the present invention can freely perform the test operation, regardless of performance of the memory tester.

That is, the synchronous memory device of the present invention can perform the sufficient margin test operation in the wafer level, and thus replaces a defect memory cell by a redundancy memory cell in the wafer level, which results in an improved yield. Moreover, the sufficient margin test can also be carried out in the package test, to improve quality.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION

A precharge control signal generator and a semiconductor memory device using the same in accordance with preferred embodiments of the present invention will now be described in detail with reference to FIGS. 7 through 11.

Figure 7:
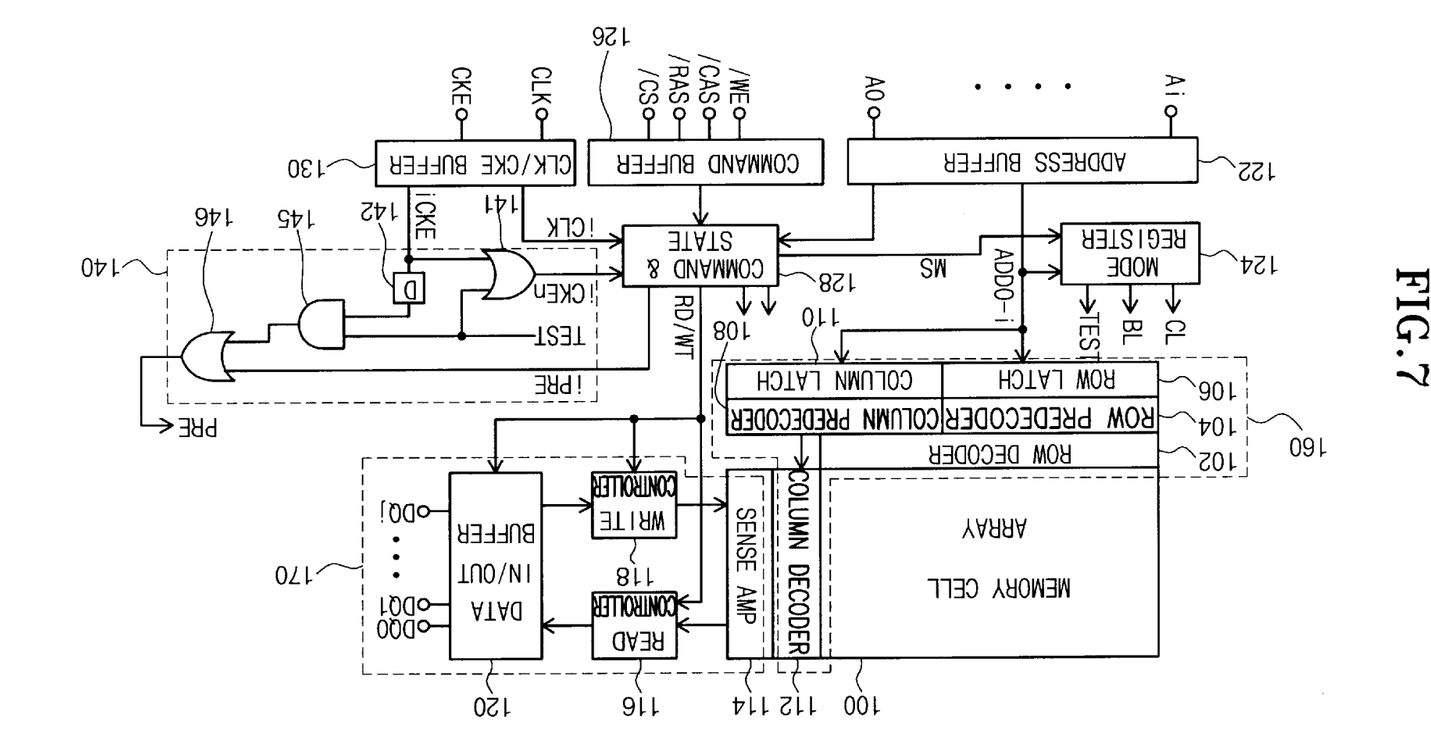
FIG. 7 is a block diagram illustrating a synchronous memory device in accordance with a first embodiment of the present invention.

FIG. 7 is a block diagram illustrating a synchronous memory device in accordance with a first embodiment of the present invention. The synchronous memory device includes a CLK/CKE buffer 130 externally receiving and buffering a clock signal CLK and a clock enable signal CKE, and generating an internal clock signal iCLK and an internal clock enable signal iCKE. A command buffer 126 receives external commands such as a chip selector bar signal /CS, a ras bar signal /RAS, a cas bar signal /CAS and a write bar signal /WE. An address buffer 122 receives external addresses A0~Ai; and a data I/O buffer 120 inputting/outputting data signals DQ0~DQj.

In addition, the synchronous memory device includes a command and state unit 128 for receiving the address signal from the address buffer 122, the internal clock signal iCLK from the CLK/CKE buffer 130, the output signal from the command buffer 126 and the internal clock enable signal iCKEn from the precharge control signal generator 140, and generating control signals for controlling internal operations. And the command and state unit 128 generates read command RD and write command WT. A mode register 124 receives the output signal from the address buffer 122 and the mode selection signal MS from the command and state unit 128, and outputs control signals CL, BL, TEST for controlling operation modes. An asynchronous precharge control signal generator 140 receives the internal precharge control signal iPRE from the command and state unit 128, the internal clock enable signal iCKE from the CLK/CKE buffer 130 and the test mode signal TEST from the mode register 124, and generates the precharge control signal PRE and the internal clock enable signal iCKEn.

The synchronous memory device also includes a memory cell array unit 100 having a plurality of memory cells for storing data. A row/column address control and decoding circuit 160 accesses a predetermined position of the memory cell array unit 100, and controls a read/write operation. An I/O data processing circuit 170 controls data input/output in the read/write operation.

The row/column address control and decoding circuit 160 includes a row latch unit 106 receiving the address signal from the address buffer 122, and latching a row address latch signal. A row predecoder 104 predecodes the row address latch signal from the row latch unit 106. A row decoder 102 decodes the output signal from the row predecoder 104, and selects a word line of the memory cell array unit 100. A column latch unit 110 receives the column address signal from the address buffer 122, and latches a column address signal. A column predecoder 108 predecodes the column address signal from the column latch unit 110. A column decoder 112 decodes the output signal from the column predecoder 108, and selects a bit line of the memory cell array unit 100.

The I/O data processing circuit 170 includes a sense amplifier unit 114 accessing the memory cell array unit 100, and sensing and amplifying data of a bit line, when data are written/read to/from the memory cell array unit 100. A read control unit 116 controls the read data from the sense amplifier unit 114 to be transmitted to the data I/O buffer 120. A write control unit 118 controls the write data from the data I/O buffer 120 to be transmitted to the sense amplifier unit 114.

Figure 8:
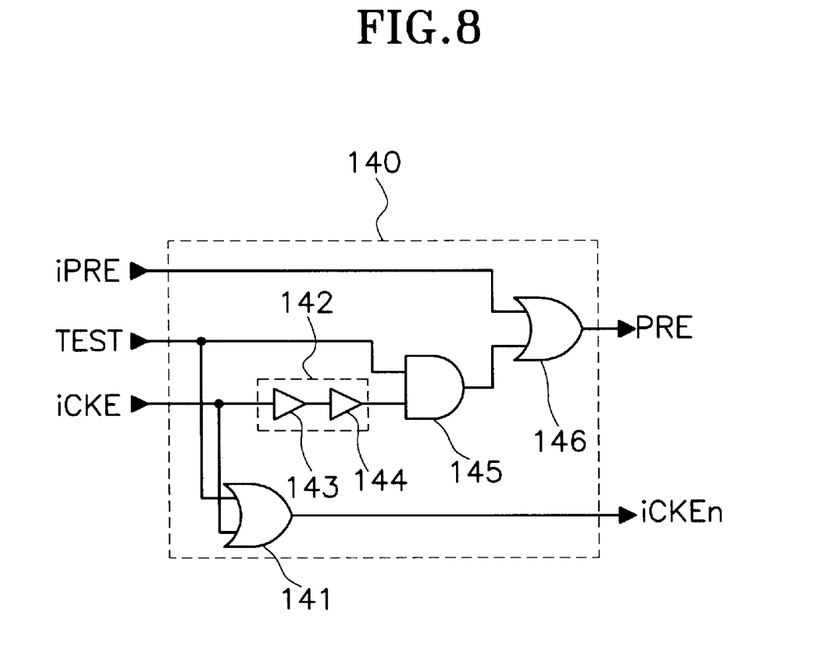
FIG. 8 is a circuit diagram illustrating a precharge control signal generator of FIG. 7.

As illustrated in FIG. 8, the precharge control signal generator 140 includes a delay chain 142 delaying the internal clock enable signal iCKE from the CLK/CKE buffer 130 for a predetermined time. The delay chain 142 comprises buffers 143, 144. An AND gate 145 ANDs the test mode detection signal TEST from the mode register 124 for controlling a precharge mode and the output signal from the delay chain 142. An OR gate 146 ORs the internal precharge control signal iPRE from the command and state unit 128 and the output signal from the AND gate 145, and outputs the precharge control signal PRE. An OR gate 141 ORs the test mode detection signal TEST and the internal clock enable signal iCKE, and generates the internal clock enable signal iCKEn.

Figure 9:
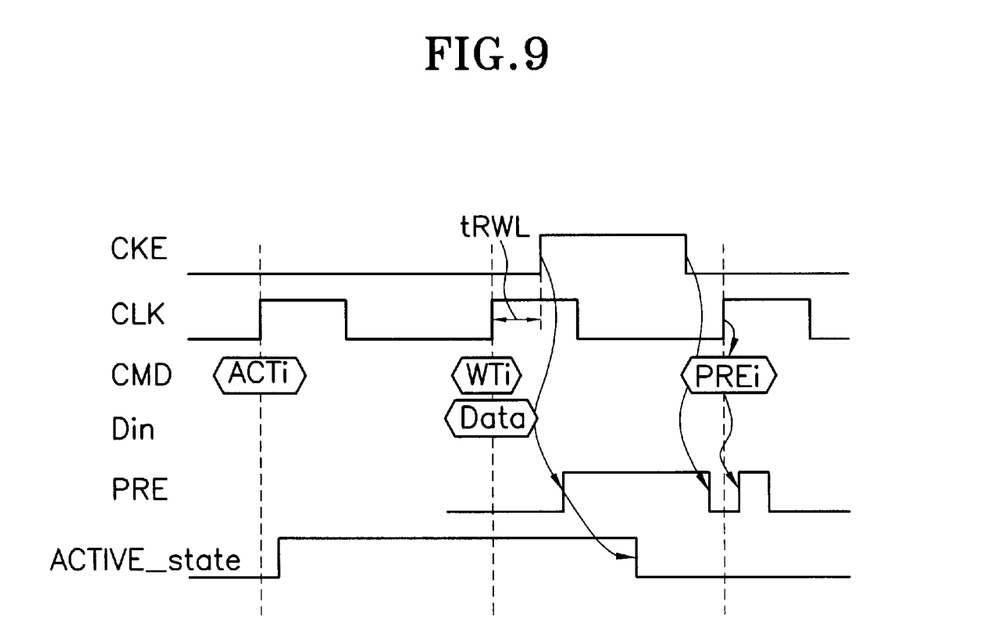
FIG. 9 is a timing diagram of the write operation in a test mode of the synchronous memory device having the precharge control signal generator of FIG. 8.

FIG. 9 is a timing diagram of the write operation in the test mode (TEST=high) of the synchronous memory device having the precharge control signal generator 140 of FIG. 8. In FIG. 9, CKE is a clock enable signal, CLK is a clock signal, CMD is a command signal, Din is a input data signal, PRE is a precharge control signal, ACTIVE_state is active state signal. An active state signal ACTIVE_state of a cell array block is set/reset according to input of the active command ACTi, the write command WTi and the precharge command PREi which are synchronous with the clock signal CLK and input of the clock enable signal CKE asynchronous from the clock signal. The rising edge of the clock signal CLK and that of the clock enable signal CKE have a delay time tRWL.

The active state signal ACTIVE_state showing an active state of the cell array block is reset according to a rising edge of the clock enable signal CKE. According to the position of the rising edge of the clock enable signal CKE, a test operation can be performed even when an interval between the commands has a minus value. In addition, the precharge control signal PRE is generated by using the clock enable signal CKE which does not influence access to the memory cell data, when the test mode detection signal TEST is internally fixed to a high or low level in the test operation. It is thus possible to input a command asynchronous from the clock signal.

The delay chain 142 can test a time difference between the precharge control signal PRE in the normal operation according to input of the precharge command PREi, and the precharge control signal PRE in the test mode according to asynchronous input of the clock enable signal CKE, thereby easily compensating for the time difference by the test result.

The rising edge of the clock enable signal CKE is used because the command input is synchronous with the rising edge of the clock signal CLK in the normal operation. It is useful in a low performance test system when a signal has a high rising/falling transition time difference.

In the precharge control signal generator 140, when a current mode is not the test mode (TEST=low), the internal clock enable signal iCKEn is equalized to the internal clock enable signal iCKE from the CLK/CKE buffer 130. In the test mode (TEST=high), the internal clock enable signal iCKEn becomes a high level, regardless of a state of the internal clock enable signal iCKE.

Therefore, the precharge control signal generator 140 generates the precharge control signal PRE according to the precharge command PREi synchronous with the clock signal CLK, or the clock enable signal. CKE which does not relate to the clock signal CLK.

Figure 10:
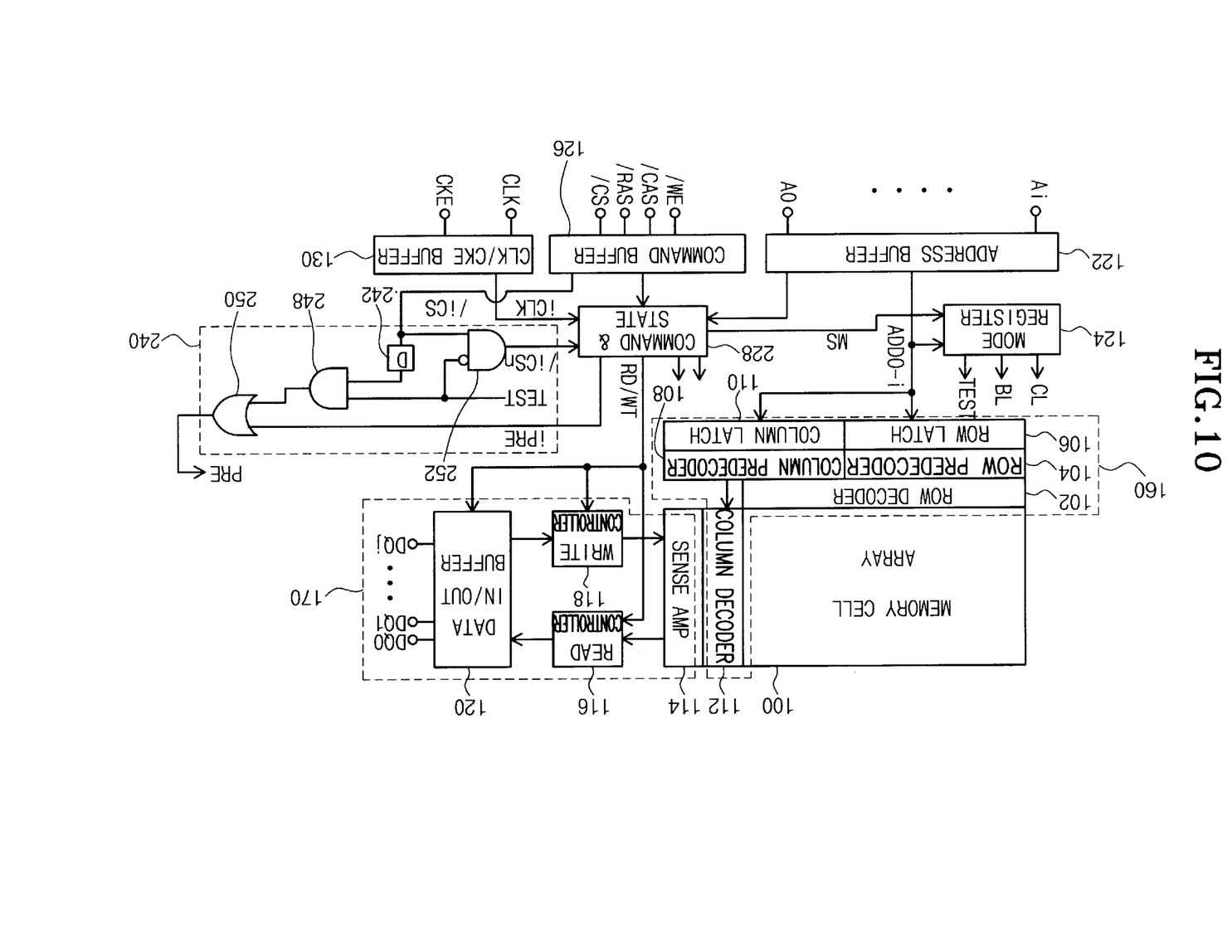
FIG. 10 is a block diagram illustrating a synchronous memory device in accordance with a second embodiment of the present invention.

FIG. 10 is a block diagram illustrating a synchronous memory device in accordance with a second embodiment of the present invention. In the following description, same drawing reference numerals are used to denote like or corresponding elements. The synchronous memory device includes a CLK/CKE buffer 130 externally receiving and buffering a clock signal CLK and a clock enable signal CKE, and generating an internal clock signal iCLK and an internal clock enable signal iCKE. A command buffer 126 receives external commands such as a chip selector bar signal /CS, a ras bar signal /RAS, a cas bar signal /CAS and a write bar signal /WE. An address buffer 122 receives external addresses A0~Ai; and a data I/O buffer 120 inputs/outputs data signals DQ0~DQj.

In addition, the synchronous memory device includes a command and state unit 228 receiving the address signal from the address buffer 122, the internal clock signal iCLK from the CLK/CKE buffer 130, the output signal from the command buffer 126 and the internal chip selector bar signal /iCSn from the precharge control signal generator 240, and generates control signals for controlling internal operations. A mode register 124 receives the output signal from the address buffer 122 and the mode selection signal MS from the command and state unit 228, and outputs control signals CL, BL, TEST for controlling operation modes. An asynchronous precharge control signal generator 240 receives the internal precharge control signal iPRE from the command and state unit 228, the internal chip selector bar signal /CS from the command buffer 126 and the test mode signal TEST from the mode register 124, and generates the precharge control signal PRE and the internal chip selector bar signal /iCSn.

The synchronous memory device also includes a memory cell array unit 100 having a plurality of memory cells for storing data. A row/column address control and decoding circuit 160 accesses a predetermined position of the memory cell array unit 100, and controls a read/write operation. An I/O data processing circuit 170 controls data input/output in the read/write operation.

The row/column address control and decoding circuit 160 includes a row latch unit 106 receiving the address signal from the address buffer 122, and latching a row address latch signal. A row predecoder 104 predecodes the row address latch signal from the row latch unit 106. A row decoder 102 decodes the output signal from the row predecoder 104, and selects a word line of the memory cell array unit 100. A column latch unit 110 receives the column address signal from the address buffer 122, and latches a column address signal. A column predecoder 108 predecodes the column address signal from the column latch unit 110. A a column decoder 112 decodes the output signal from the column predecoder 108, and selects a bit line of the memory cell array unit 100.

The I/O data processing circuit 170 includes a sense amplifier unit 114 accessing the memory cell array unit 100, and senses and amplifies data of a bit line, when data are written/read to/from the memory cell array unit 100. A read control unit 116 controls the read data from the sense amplifier unit 114 to be transmitted to the data I/O buffer 120. A write control unit 118 controls the write data from the data I/O buffer 120 to be transmitted to the sense amplifier unit 114.

Figure 11:
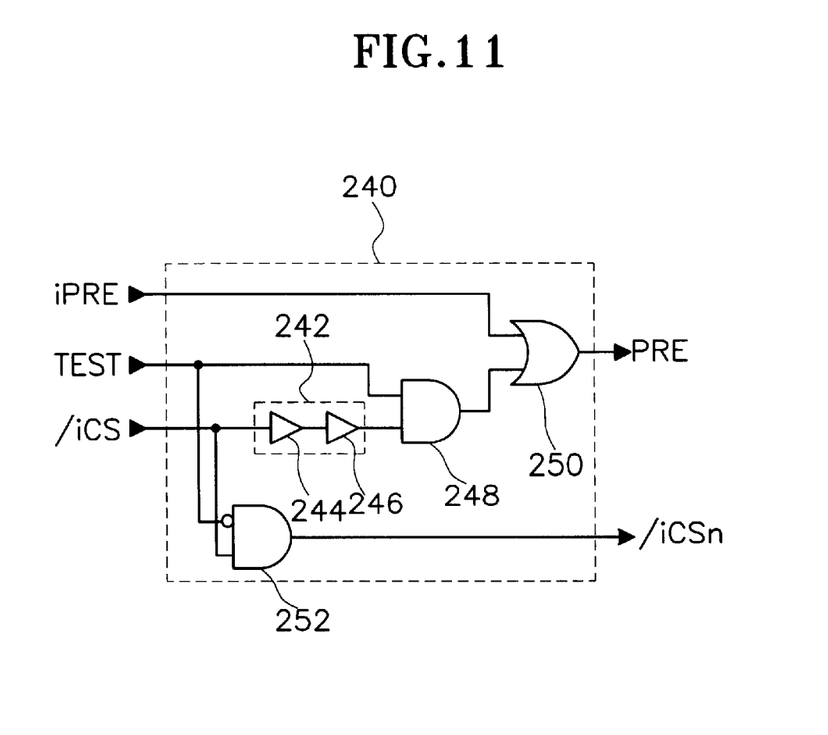
FIG. 11 is a circuit diagram illustrating a precharge control signal generator of FIG. 10.

As shown in FIG. 11, the precharge control signal generator 240 includes a delay chain 242 delaying the internal chip selector bar signal /iCS from the command buffer 126 for a predetermined time. An AND gate 248 ANDs the test mode detection signal TEST from the mode register 124 for controlling a precharge mode and the output signal from the delay chain 242. An OR gate 250 ORs the internal precharge control signal iPRE from the command and state unit 228 and the output signal from the AND gate 248, and outputs the precharge control signal PRE. An AND gate 252 ANDs an inverted signal of the test mode detection signal TEST and the internal chip selector signal iCSB, and generates the internal chip selector bar signal iCSn.

Figure 12:
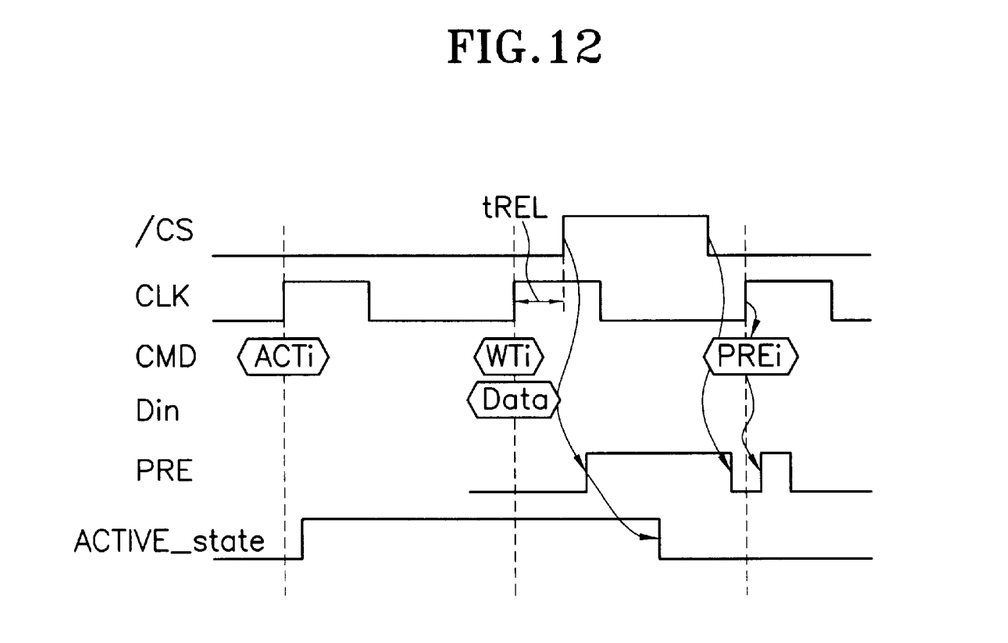
FIG. 12 is a timing diagram of the write operation in a test mode of the synchronous memory device having the precharge control signal generator of FIG. 11.

FIG. 12 is a timing diagram of the write operation in the test mode (TEST=high) of the synchronous memory device having the precharge control signal generator 240 of FIGS. 10 and 11. An active state signal ACTIVE_state activating the memory cell array unit 100 is set/reset according to a rising period of the precharge command signal PRE synchronous with the clock signal CLK and a falling period of the chip selector bar signal /CS asynchronous from the clock signal CLK.

The active state signal ACTIVE_state showing an active state of the cell array block is reset according to a rising edge of the chip selector bar signal /CS. According to the position of the rising edge of the clock enable signal CKE, a test operation can be performed even when an interval between the commands has a minus value. In addition, the precharge control signal PRE is generated by using the chip selector bar signal /CS which does not influence access to the memory cell data, when the test mode detection signal TEST is internally fixed to a high or low level in the test operation. It is thus possible to input a command asynchronous from the clock signal.

The delay chain 246 can test a time difference between the precharge control signal PRE in the normal operation according to input of the precharge command PREi, and the precharge control signal PRE in the test mode according to asynchronous input of the chip selector bar signal /CS, thereby easily compensating for the time difference by the test result.

The rising edge of the chip selector bar signal /CS is used because the command input is synchronous with the rising edge of the clock signal CKL in the normal operation. It is useful in a low performance test system when a signal has a high rising/falling transition time difference.

In the precharge control signal generator 240, when a current mode is not the test mode (TEST=low), the internal chip selector bar signal /iCSn is equalized to the internal chip selector bar signal /iCS from the command buffer 126. In the test mode (TEST=high), the internal chip selector bar signal /iCSn becomes a high level, regardless of a state of the internal chip selector bar signal /iCS.

Therefore, the precharge control signal generator 240 generates the precharge control signal PRE according to the precharge command PREi synchronous with the clock signal CLK, or the chip selector bar signal /CS which does not relate to the clock signal CLK.

As discussed earlier, the synchronous memory device having the asynchronous precharge function can input an interval between the commands regardless of the dock period, by generating the precharge control signal PRE by using the clock enable signal CKE or chip selector bar signal /CS which is not synchronous with the clock signal CLK, when intending to generate the precharge control signal PRE for the test mode after input of the write command in the write operation.

In order to efficiently test a specific operation parameter of the high frequency synchronous memory device in a wafer or package level and screen a defect thereof, the test operation should be performed with a sufficient margin. The conventional synchronous DRAM using the precharge control signal generator cannot obtain a sufficient margin due to poor performance of the memory tester. However, the synchronous memory device having the asynchronous precharge function in accordance with the present invention can freely perform the test operation, regardless of performance of the memory tester.

That is, the synchronous memory device of the present invention can perform the sufficient margin test operation in the wafer level, and thus replaces a defect memory cell by a redundancy memory cell in the wafer level, which results in an improved yield. Moreover, the sufficient margin test can also be carried out in the package test, to improve quality.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are intended to be embraced by the appended claims.

What is claimed is:

1. A semiconductor memory device with a normal mode and a test mode, comprising:
    a memory cell array for storing data; and
    a precharge control signal generator for generating a precharge control signal in the test mode, by using a predetermined control signal which does not influence access to the data stored in the memory cell array, even when maintained in a high or low level in the test mode.

2. The device according to claim 1, wherein the precharge control signal generator receives the predetermined control signal, outputs a signal having an identical state to the control signal in the normal mode, and outputs a signal fixed in a high or low level in the test mode.

3. The device according to claim 1, wherein the precharge control signal generator includes a delay unit for equalizing a setting time of the precharge control signal after input of a command in the normal mode to a setting time of the precharge control signal after input of the control signal in the test mode.

4. The device according to claim 1, wherein, when input of commands is synchronous with a rising edge of the clock signal in the normal mode, the precharge control signal generator generates the precharge control signal synchronously with the rising edge of the control signal in the test mode.

5. A precharge control signal generator for a semiconductor memory device with a normal mode and a test mode, comprising:
    an internal control signal generator for receiving a predetermined control signal which does not influence access to a memory cell data in the test mode, outputting a signal fixed in a high or low level in the test mode, and outputting a signal having an identical state to the control signal in the normal mode;

a delay unit for delaying the control signal in the test mode as long as a setting time of a precharge control signal after input of a command in the normal mode; and a logic gate for ORing the precharge control signal of the normal mode and the output signal from the delay unit.

6. A synchronous memory device comprising:

a memory cell array unit having a plurality of memory cells for storing a plurality of data;

a CLK/CKE buffer externally receiving a clock signal and a clock enable signal, and generating an internal clock signal and an internal clock enable signal;

a command buffer receiving external commands such as a chip selector bar signal, a ras bar signal, a cas bar signal and a write bar signal;

an address buffer receiving external addresses;

a data I/O buffer inputting/outputting data signals;

a command and state unit receiving the address signal from the address buffer, the internal clock signal from the CLK/CKE buffer, the output signal from the command buffer and the internal clock enable signal from the precharge control signal generator, and generating control signals for controlling internal operations;

a mode register receiving the address signal from the address buffer and the mode selection signal from the command and state unit, and outputting control signals for controlling operation modes;

a row/column address control and decoding circuit accessing a predetermined position of the memory cell array unit according to the address signal from the address buffer, and controlling a read/write operation;

an I/O data processing circuit controlling.data input/output in the read/write operation according to the output signal from the command and state unit; and an asynchronous precharge control signal generator receiving the internal precharge control signal from the command and state unit, the internal clock enable signal from the CLK/CKE buffer and the test mode signal from the mode register, and generating the internal clock enable signal and a precharge control signal.

7. The device according to claim 6, wherein the row/column address control and decoding circuit comprises:

a row latch unit receiving the address signal from the address buffer, and latching a row address signal;

a row predecoder predecoding the row address signal from the row latch unit;

a row decoder decoding the output signal from the row predecoder, and selecting a word line of the memory cell array unit;

a column latch unit receiving the column address signal from the address buffer, and latching a column address signal;

a column predecoder predecoding the column address signal from the column latch unit; and a column decoder decoding the output signal from the column predecoder, and selecting a bit line of the memory cell array unit.

8. The device according to claim 6, wherein the I/O data processing circuit comprises:

a sense amplifier unit sensing and amplifying data of the bit line, when data are written/read to/from the memory cell array unit;

a read control unit controlling the read data from the sense amplifier unit to be transmitted to the data I/O buffer; and a write control unit controlling the write data from the data I/O buffer to be transmitted to the sense amplifier unit.

9. The device according to claim 6, wherein the precharge control signal generator comprises:

a delay chain delaying the internal clock enable signal from the CLK/CKE buffer for a predetermined time;

an AND gate ANDing the test mode detection signal from the mode register for controlling a precharge mode and the output signal from the delay chain;

an OR gate ORing the internal precharge control signal from the command and state unit and the output signal from the AND gate, and outputting the precharge control signal; and an OR gate ORing the test mode detection signal and the internal clock enable signal, and generating the internal clock enable signal.

10. The device according to claim 9, wherein the delay chain consists of an even number of inverters.

11. A synchronous memory device comprising:

a memory cell array unit having a plurality of memory cells for storing a plurality of data;

a CLK/CKE buffer externally receiving a clock signal and a clock enable signal, and generating an internal clock signal;

a command buffer receiving external commands such as a chip selector bar signal, a ras bar signal, a cas bar signal and a write bar signal;

an address buffer receiving external addresses;

a data I/O buffer inputting/outputting data signals;

a command and state unit receiving the address signal from the address buffer, the internal clock signal from the CLK/CKE buffer, the output signal from the command buffer and the internal chip selector bar signal from the precharge control signal generator, and generating control signals for controlling internal operations;

a mode register receiving the address signal from the address buffer and the mode selection signal from the command and state unit, and outputting control signals for controlling operation modes;

a row/column address control and decoding circuit accessing a predetermined position of the memory cell array unit according to the address signal from the address buffer, and controlling a read/write operation;

an I/O data processing circuit controlling data input/output in the read/write operation according to the output signal from the command and state unit; and an asynchronous precharge control signal generator receiving the internal precharge control signal from the command and state unit, the internal chip selector bar signal from the command buffer and the test mode signal from the mode register, and generating the internal chip selector bar signal and a precharge control signal.

12. The device according to claim 11, wherein the row/column address control and decoding circuit comprises:

a row latch unit receiving the address signal from the address buffer, and latching a row address signal;

a row predecoder predecoding the row address signal from the row latch unit;

a row decoder decoding the output signal from the row predecoder, and selecting a word line of the memory cell array unit;

a column latch unit receinving the column address signal from the address buffer, and latching a column address signal;

a column predecoder predecoding the column address signal from the column latch unit; and a column decoder decoding the output signal from the column predecoder, and selecting a bit line of the memory cell array unit.

13. The device according to claim 11, wherein the I/O data processing circuit comprises:

a sense amplifier unit sensing and amplifying data of the bit line, when data are written/read to/from the memory cell array unit;

a read control unit controlling the read data from the sense amplifier unit to be transmitted to the data I/O buffer; and a write control unit controlling the write data from the data I/O buffer to be transmitted to the sense amplifier unit.

14. The device according to claim 11, wherein the precharge control signal generator comprises:

a delay chain delaying the internal chip selector bar signal from the command buffer for a predetermined time;

an AND gate ANDing the test mode detection signal from the mode register for controlling a precharge mode and the output signal from the delay chain;

an OR gate ORing the internal precharge control signal from the command and state unit and the output signal from the AND gate, and outputting the precharge control signal; and an AND gate ANDing an inverted signal of the test mode detection signal and the internal chip selector signal, and generating the internal chip selector bar signal.

15. The device according to claim 14, wherein the delay chain consists of an even number of inverters.

* * * * *